United States Patent
Jasper

(10) Patent No.: US 7,310,131 B2
(45) Date of Patent: Dec. 18, 2007

(54) LITHOGRAPHIC APPARATUS AND DEVICE MANUFACTURING METHOD

(75) Inventor: Johannes Christiaan Maria Jasper, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 205 days.

(21) Appl. No.: 11/194,764

(22) Filed: Aug. 2, 2005

(65) Prior Publication Data

US 2007/0030469 A1 Feb. 8, 2007

(51) Int. Cl.
*G03B 27/72* (2006.01)
*G03B 27/42* (2006.01)
*G02B 9/00* (2006.01)

(52) U.S. Cl. .................. 355/71; 355/53; 359/739

(58) Field of Classification Search ............ 355/53, 355/67, 71; 359/738, 739, 740
See application file for complete search history.

(56) References Cited

U.S. PATENT DOCUMENTS

| 5,363,172 A | * 11/1994 | Tokuda ............... 355/71 |
| 5,706,091 A | * 1/1998 | Shiraishi ............. 356/399 |
| 6,445,510 B1 | 9/2002 | Schuster et al. |
| 6,884,699 B1 | 4/2005 | Ogawa et al. |
| 2005/0099614 A1 | 5/2005 | Sugita et al. |
| 2006/0256447 A1 | * 11/2006 | Dodoc ............... 359/649 |

* cited by examiner

*Primary Examiner*—Alan Mathews
(74) *Attorney, Agent, or Firm*—Pillsbury Winthrop Shaw Pittman LLP

(57) ABSTRACT

The projection system of a lithographic apparatus has a plurality of pupil planes and at least two irises provided in respective pupil planes each optimized to provide a high degree of NA uniformity over a respective NA range so that a high degree of NA uniformity can be provided over a wide range of NA settings.

14 Claims, 3 Drawing Sheets

LITHOGRAPHIC APPARATUS AND DEVICE MANUFACTURING METHOD

BACKGROUND OF THE INVENTION

1. Field of the Invention

The present invention relates to lithographic apparatus and to a device manufacturing method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

As lithographic apparatus are used to manufacture devices with ever smaller critical dimension (CD), i.e. the dimension of a feature or features in which variations will cause undesirable variation in physical properties of the feature, in lithography shrinks, such as the gate width of a transistor, it is often necessary to use a high numeric aperture (NA), e.g. of greater than 1, to achieve the required high resolution. However, the higher the NA the lower the depth of focus so that it is desirable to be able to adjust the NA setting of an apparatus to enable printing of layers where depth of focus is more important than resolution or line width.

The NA of a projection system can be adjusted by providing a carousel arrangement with a plurality of aperture plates or an adjustable iris diaphragm in the pupil plane of the projection system. However, carousel arrangements are bulky and provide only a limited number of NA settings so that irises are more commonly used. These include an arrangement of leaves, e.g. 4 or 6 or more, arranged around a central aperture and pivotable to vary the diameter of that aperture. As a finite number of leaves is used, the aperture is inevitably polygonal (with curved sides) rather than perfectly circular except at one NA setting so that at other NA settings the NA of the projection system will not be uniform in all directions. The NA uniformity is therefore only acceptable for a relatively small range of aperture diameters and hence NA settings. Increasing the number of plates increases the range over which acceptable NA uniformity can be obtained but increases the bulk and complexity of the iris. An example of an iris diaphragm is disclosed in U.S. Pat. No. 6,445,510.

SUMMARY OF THE INVENTION

It is desirable to provide an improved arrangement for adjusting the NA setting of a projection system in a lithographic apparatus, in particular that can provide a greater range of NA settings and/or improved NA uniformity.

According to an aspect of the invention, there is provided a lithographic apparatus having a projection system for projecting an image of a pattern onto a target portion of a substrate, wherein the projection system has at least two pupil planes and comprises:

at least two aperture adjustment devices, each provided in or near a respective one of the pupil planes and each separately controllable to vary its open aperture.

According to an aspect of the invention, there is provided a device manufacturing method using a lithographic apparatus to project a pattern onto a substrate, wherein the lithographic apparatus has a projection system that includes at least two pupil planes, the method comprising:

providing at least two aperture adjustment devices in or near respective ones of the pupil planes and setting the aperture adjustment devices to provide a desired numeric aperture setting.

According to an aspect of the invention, there is provided a lithographic apparatus, comprising:

a projection system having first and second pupil plane;

a first adjustable iris provided in or near the first pupil plane and having iris plates shaped to provide a nearly circular aperture over a first range of opening diameters corresponding to a first range of numeric aperture settings; and a second adjustable iris provided in or near the second pupil plane and having iris plates shaped to provide a nearly circular aperture over a second range of opening diameters corresponding to a second range of numeric aperture settings;

wherein the first range of numeric aperture settings is different than the second range of numeric aperture settings.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
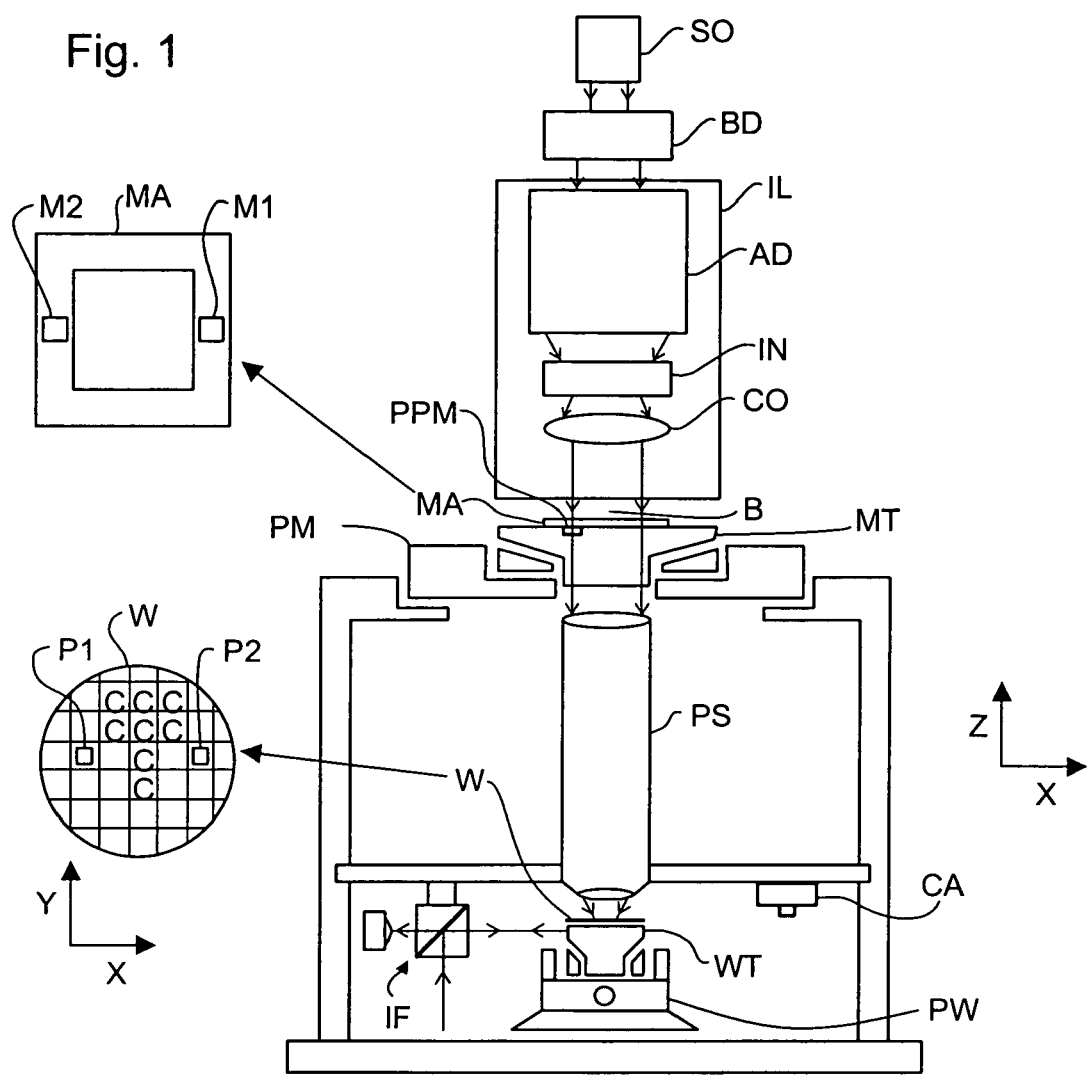
FIG. 1 depicts a lithographic apparatus according to an embodiment of the invention.

FIG. 1 schematically depicts a lithographic apparatus used in one embodiment of the invention. The apparatus includes an illumination system (illuminator) IL configured to condition a radiation beam B (e.g. UV radiation or DUV radiation); a support (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
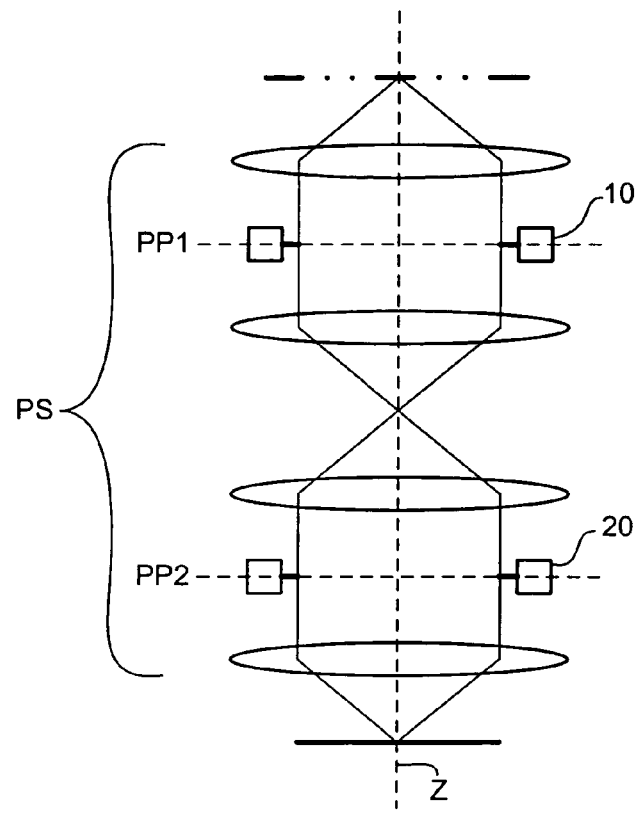
FIG. 2 depicts the projection system of the apparatus of FIG. 1.

In an embodiment of the invention, the projection system PS includes a series of lenses arranged to project a demagnified (e.g. magnification=¼ or ⅕) image of a part of a mask pattern, e.g. in a mask MA, placed in an object plane of the system onto a target portion of a substrate W placed in an image plane. This is shown schematically in FIG. 2. The projection system has at least two, for example three, pupil planes PP1, PP2, that is planes that are Fourier conjugates of the object and/or image planes. As is well known, the size of the aperture in the pupil planes defines the numeric aperture (NA) of the system; where there are several pupil planes, the aperture that defines the smallest NA defines the overall NA of the system. It should be noted that where lenses in the system have a power of magnification not equal to 1, the pupil planes may not be at the same scale, so it may not be that the dimensionally smallest aperture defines the smallest NA.

Figure 3:
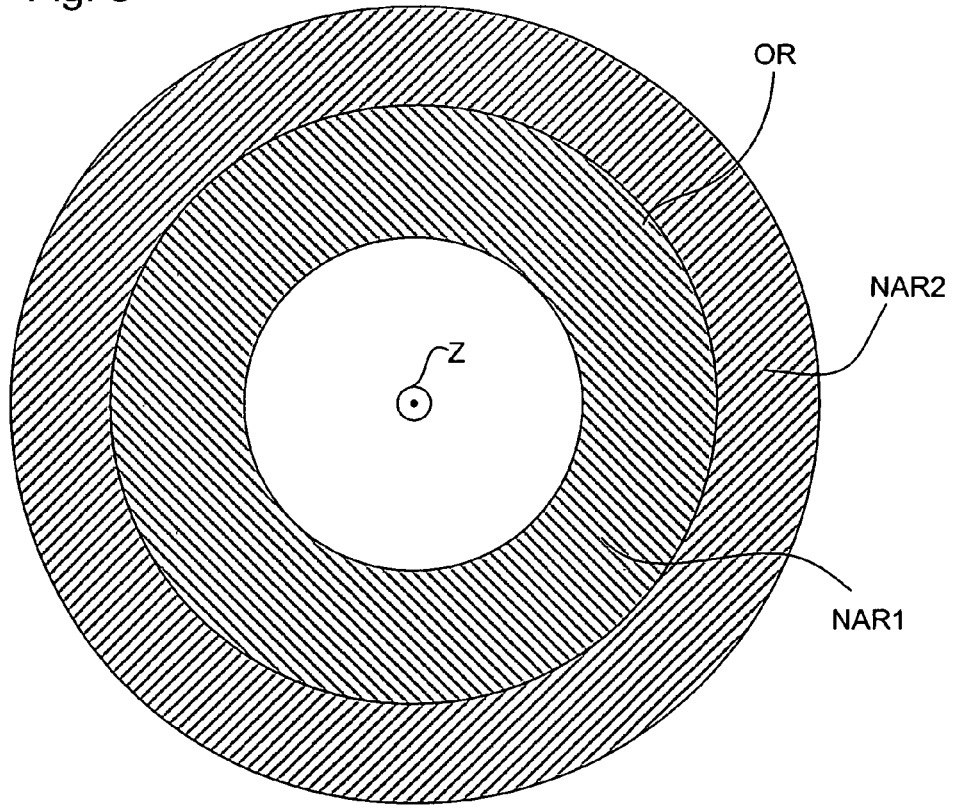
FIG. 3 depicts overlapping NA ranges.

In the embodiment, iris diaphragms 10, 20 are positioned in pupil planes PP1, PP2 respectively. The projection system is designed to have a maximum NA value $NA_{max}$ of, for example 1.2. Iris diaphragms 10, 20 can reduce this when closed to a smaller diameter. For example, iris 10 may be sized to stop down to an NA of 0.65 and its leaves curved so as to provide a nearly circular aperture in a first NA range NAR1 of from about 0.65 to about 0.9. Similarly, iris diaphragm may be sized to stop down to a little under 0.9 and its leaves curved to provide a nearly circular aperture in a second NA range NAR2 of from about 0.9 to about 1.2. Which ever iris is stopped down to the lower NA value will define the overall NA value of the projection system PS and therefore, as shown in FIG. 3, the embodiment can provide a uniform NA setting over the combined ranges of the two irises.

Figure 4:
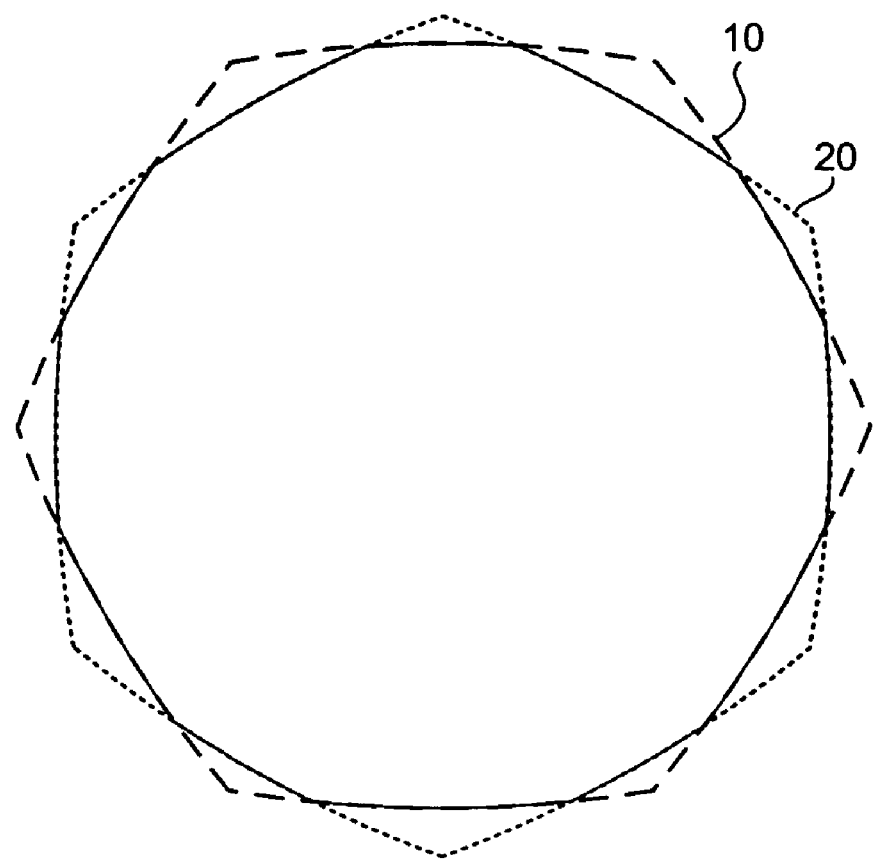
FIG. 4 depicts overlapping polygonal apertures.

In the case where the NA ranges NAR1, NAR2 overlap, either iris may be used to set an NA value in the overlap region OR. Since this region is at the extreme of both iris's optimum ranges, the aperture set by either iris will not be perfectly circular. By arranging that the two irises are rotationally offset relative to each other about the optical axis Z, a more uniform NA setting can be achieved by setting each iris to an NA setting slightly larger than the desired setting. As can be seen in FIG. 4, the combined aperture, shown by a solid line, is slightly smaller and more circular than the apertures provided by irises 10, 20 which are shown by dashed and dotted lines respectively.

In a projection system that has more than two pupil planes, it is possible to use more than two irises so that each has to cover a smaller range and hence can be arranged to provide a more uniform aperture over just that range. In some cases however, not all pupil planes in the projection system will be suitable for the provision of irises, e.g. because there is insufficient space between lens elements.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus having a projection system for projecting an image of a pattern onto a target portion of a substrate, wherein the projection system is configured and arranged to receive a patterned beam of radiation from a patterning device of the lithographic apparatus and to project the patterned beam of radiation onto a target portion of a substrate held by a substrate table of the lithographic apparatus, has at least two pupil planes and comprises:
   at least two aperture adjustment devices, each provided in or near a respective one of the pupil planes and each separately controllable to vary its open aperture.

2. Apparatus according to claim 1, wherein at least one of the aperture adjustment devices comprises an iris.

3. Apparatus according to claim 2, wherein at least two of the aperture adjustment devices comprise irises.

4. Apparatus according to claim 3, wherein the irises are rotationally offset from one another relative to an optical axis of the projection system.

5. Apparatus according to claim 1, wherein the combined range of numeric aperture settings that can be provided by the aperture adjustment devices is from about 0.65 to about 1.2.

6. Apparatus according to claim 5, wherein a first one of the aperture adjustment devices can provide numeric aperture settings in a range of from about 0.65 to about 0.9 and a second one of the aperture adjustment devices can provide numeric aperture settings in a range of from about 0.9 to about 1.2.

7. Apparatus according to claim 1, wherein a first one of the aperture adjustment devices is arranged to provide an aperture with a relatively high numeric aperture uniformity over a first range of numeric aperture values and a second one of the aperture adjustment devices is arranged to provide an aperture with a relatively high numeric aperture uniformity over a second range of numeric aperture values, the first and second ranges being different.

8. Apparatus according to claim 7, wherein the first and second ranges overlap.

9. A device manufacturing method using a lithographic apparatus to project a pattern onto a substrate, wherein the lithographic apparatus has a projection system configured and arranged to receive a patterned beam of radiation from a patterning device of the lithographic apparatus and to project the patterned beam of radiation onto a target portion of a substrate held by a substrate table of the lithographic apparatus, and that includes at least two pupil planes, the method comprising:
   providing at least two aperture adjustment devices in or near respective ones of the pupil planes and
   setting the aperture adjustment devices to provide a desired numeric aperture setting.

10. A lithographic apparatus, comprising:
   a projection system having first and second pupil plane;
   a first adjustable iris provided in or near the first pupil plane and having iris plates shaped to provide a nearly circular aperture over a first range of opening diameters corresponding to a first range of numeric aperture settings; and
   a second adjustable iris provided in or near the second pupil plane and having iris plates shaped to provide a nearly circular aperture over a second range of opening diameters corresponding to a second range of numeric aperture settings;
   wherein the first range of numeric aperture settings is different than the second range of numeric aperture settings.

11. Apparatus according to claim 10, wherein the combined range of numeric aperture settings that can be provided by the aperture adjustment devices is from about 0.65 to about 1.2.

12. Apparatus according to claim 10, wherein a first one of the aperture adjustment devices can provide numeric aperture settings in a range of from about 0.65 to about 0.9 and a second one of the aperture adjustment devices can provide numeric aperture settings in a range of from about 0.9 to about 1.2.

13. Apparatus according to claim 12, wherein a first one of the aperture adjustment devices can provide numeric aperture settings in a range of from about 0.65 to about 0.9 and a second one of the aperture adjustment devices can provide numeric aperture settings in a range of from about 0.9 to about 1.2.

14. Apparatus according to claim 10, wherein the first and second ranges overlap.

* * * * *